(12) United States Patent
Wang et al.

(10) Patent No.: US 8,642,390 B2
(45) Date of Patent: Feb. 4, 2014

(54) TAPE RESIDUE-FREE BUMP AREA AFTER WAFER BACK GRINDING

(75) Inventors: Chung Yu Wang, Hsinchu (TW); Jiann-Jong Wang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 447 days.

(21) Appl. No.: 12/726,317

(22) Filed: Mar. 17, 2010

(65) Prior Publication Data
US 2011/0230043 A1 Sep. 22, 2011

(51) Int. Cl.
*H01L 21/00* (2006.01)
*H01L 21/46* (2006.01)

(52) U.S. Cl.
USPC ........... 438/114; 438/118; 438/459; 438/613; 257/E21.499

(58) Field of Classification Search
USPC ................. 438/613, 612, 108, 114, 118, 459; 257/E21.499
See application file for complete search history.

(56) References Cited

U.S. PATENT DOCUMENTS

| 5,087,585 | A | * | 2/1992 | Hayashi | 438/155 |
| 6,060,373 | A | * | 5/2000 | Saitoh | 438/459 |
| 6,638,837 | B1 | * | 10/2003 | Tsao et al. | 438/459 |
| 7,242,099 | B2 | * | 7/2007 | Lin et al. | 257/778 |
| 7,452,747 | B2 | * | 11/2008 | Chan et al. | 438/106 |
| 2002/0100972 | A1 | * | 8/2002 | Kitajima et al. | 257/734 |
| 2005/0142696 | A1 | * | 6/2005 | Tsai | 438/114 |

FOREIGN PATENT DOCUMENTS

TW 429398 4/2001
TW 200522180 7/2005

OTHER PUBLICATIONS

Office Action from corresponding application No. CN 201010257040.6.

* cited by examiner

*Primary Examiner* — Michael Trinh
(74) *Attorney, Agent, or Firm* — Lowe Hauptman & Ham, LLP

(57) ABSTRACT

Organic-adhesive tapes are often used to secure and protect the bumps during wafer processing after bump formation. While residual organic-adhesive tape may remain on the wafer after tape de-lamination, applying a bump template layer on the bumps before laminating the tape allows any residue to be removed afterwards and results in a residue-free wafer.

20 Claims, 4 Drawing Sheets

US 8,642,390 B2

TAPE RESIDUE-FREE BUMP AREA AFTER WAFER BACK GRINDING

TECHNICAL FIELD

The disclosure relates generally to semiconductor bump processes, and more particularly to methods for packaging semiconductor devices.

BACKGROUND

The packaging of integrated circuit (IC) chips is one of the most important steps in the manufacturing process, contributing significantly to the overall cost, performance and reliability of the packaged chip. As semiconductor devices reach higher levels of integration, packaging technologies have become critical. Packaging of the IC chip accounts for a considerable portion of the cost of producing the device and failure of the package leads to costly yield reduction.

As semiconductor device sizes have decreased, the density of devices on a chip has increased, along with the size of the chip, thereby making chip bonding more challenging. Many chip bonding technologies use solder bumps attached to a contact pad, or the bonding pad, on the chip to make a connection from the chip to the package substrate. Small solder balls are used to make many connections to package substrates when a chip is inverted and attached onto a package substrate via the solder balls. Since the solder balls can form an area array (a "ball grid array" (BGA)), this method can achieve a very high-density scheme for chip interconnections. The flip-chip method has the advantage of achieving a very high density of interconnection to the device with a very low parasitic inductance. Increasingly, the chip substrate is thinned before packaging to reduce the final size of the device and to reduce thermal expansion coefficient mismatch issues. After the solder balls are formed, a backside of the substrate is grinded to a small thickness before bonding to the package substrate.

To maintain robust electrical performance during the life of the chip package, the solder balls not only need to make a good electrical connection to the package substrate, but also need to maintain structural integrity and good electrical connection over the life of the device. Unwanted particles and residues from packaging processes can adversely affect the device performance by causing cracks in the soldered connection or increasing electrical resistance. Moreover, it is desirable to have process conditions that can accommodate a wide variety of chip designs in semiconductor manufacturing. Accordingly, there is a need for packaging methods to form residue-free bump areas after wafer grinding that allow a wide process window.

BRIEF DESCRIPTION OF THE DRAWINGS

The disclosure will be described with reference to embodiments thereof as illustrated in the accompanying figures. It should be understood that the drawings are for illustrative purposes and are therefore not drawn to scale.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative of specific ways to make and use the invention, and do not limit the scope of the invention.

Various embodiments of the present invention involve methods to ensure that the bumped wafer is residue-free before bonding with the package substrate. Organic-adhesive tapes are often used to secure and protect the bumps (e.g. solder alloy, gold, copper, other metals, etc.) during wafer backgrinding processing after bump formation. As used herein, organic-adhesive tape refers to the adhesive and the backing tape. The adhesive is generally made of an organic material in two categories: ultraviolet (UV) tapes and non-UV tapes. The UV tapes employ an adhesive layer having a chemical bond that are broken under UV light so that the tape may be removed more easily. If UV tape is used, the tape is exposed to UV light at a specified wavelength before it is removed or de-laminated from the wafer. While parts of the organic-adhesive tape may remain on the bump surface of wafer after tape de-lamination, applying a bump template layer on the bumps before laminating the tape allows any residue to be removed afterwards and results in a residue-free bumped wafer.

Figure 1:
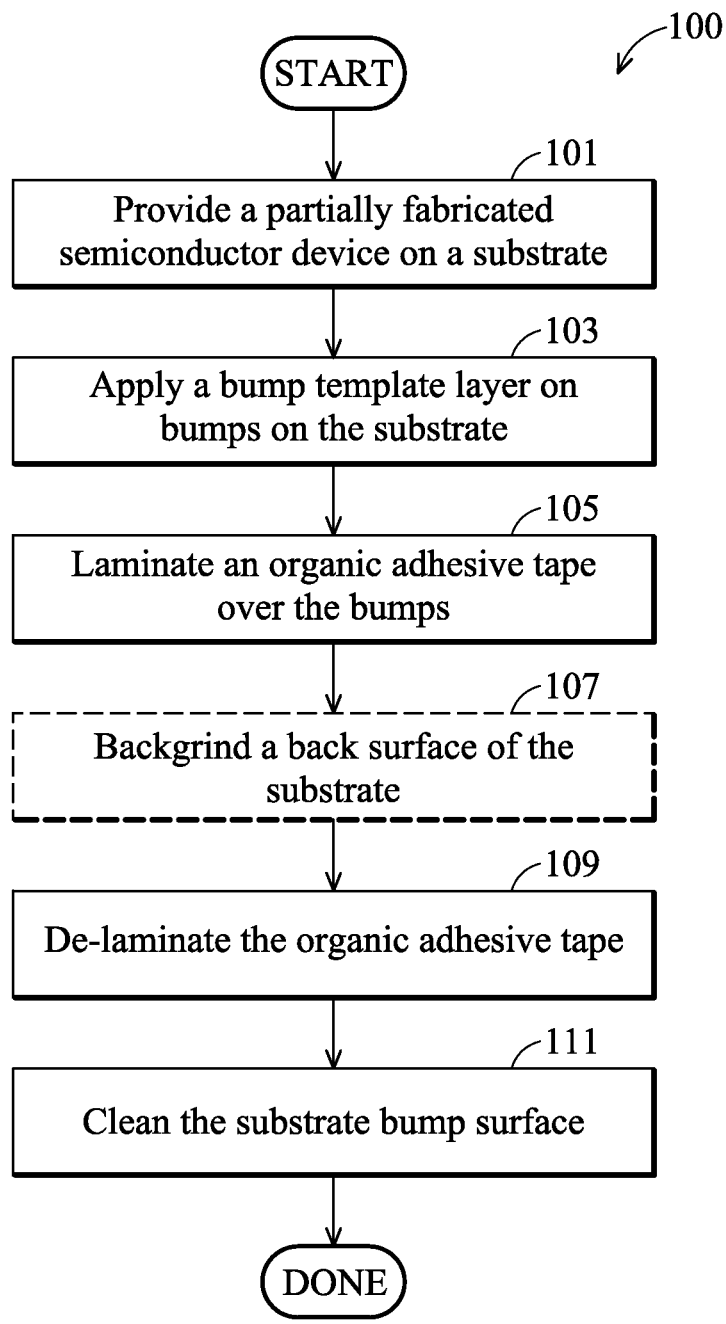
FIG. 1 shows a process flow chart of a method for fabricating residue-free bumped wafer in accordance with various embodiments of the present invention.

FIG. 1 shows a process flow diagram of a method 100 in accordance with various embodiments of the present invention. In operation 101, a partially fabricated semiconductor substrate is provided. Typically, wafer fabrication for a chip is completed at this stage and the partially fabricated substrate is to be packaged into a final product. The substrate typically includes many partially fabricated semiconductor chips, each in a separate region separated by scribe lines. Each of these separate regions becomes a die when the wafer is singulated, or diced, along the scribe lines. At this stage, the partially fabricated semiconductor chip includes bumps on one side of the substrate. These bumps may be arranged into various patterns or arrays and may be of size from several microns to hundreds of microns or larger. A side view of a substrate having bumps attached is shown as FIG. 2.

Figure 2:
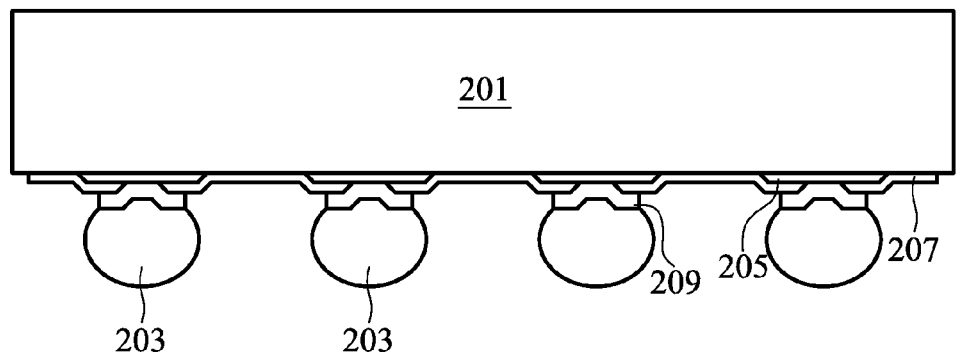
FIGS. 2-8 shows a bump structure during various stages of the method in accordance with various embodiments.

Referring to FIG. 2, a substrate 201 is shown having bumps 203 attached. Substrate 201 includes various embedded semiconductor metal and dielectric layers corresponding to circuitry and semiconductor devices, such as transistors, resistors, capacitors, and diodes (not shown). The circuitry and devices are electrically connected to bond pads 205. Bond pads are conductive and typically include a metal, such as copper and aluminum. As shown in FIG. 2, bond pads 205 are partially covered by passivation layer 207, which may be polyimide, a polymer adhesive, or other insulating buffer material. An under bump metal (UBM) 209 fills an opening between the passivation layer material. The UBM 209 is an adhesion layer to attach the bond pad material, typically mostly aluminum, to the bump material, typically an alloy of tin. The UBM 209 may include one or more layers and can include nickel, molybdenum, and other metals suitably adhering to the required material. The bumps 203 are formed on the UBM 209 typically by a plating or printing process and formed into a partial ball shape by heating the solder material. An area of the bump closest to the UBM 209 is referred to as the waist of the bump, as the circumference at the waist is smaller than that at the widest point. Residues from organic-adhesive tapes at the waist area can cause a short between the bumps if the residue is large and change the resistance of the conductive path if the residue is small. Tape residues at the waist and top portions are often hard to clean and may cause a bad connection if subsequent soldering incorporates it into the connection.

Figure 3:
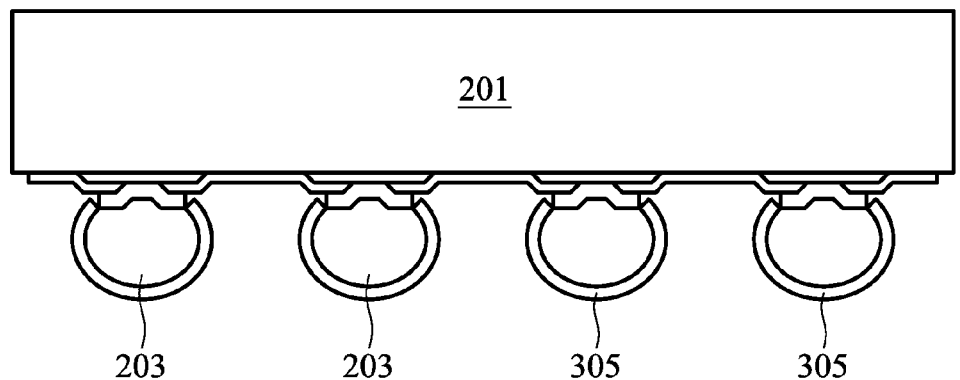

Referring to FIG. 1, in operation 103 a bump template layer is applied on the bumps on the substrate. A bump template layer is a layer of coating applied to the bump side of the semiconductor substrate before the organic-adhesive tape. In certain embodiments, the bump template layer is applied as in FIG. 3. In these embodiments, the bump template layer 305 is a coating on the outside of the bumps 203 and does not coat the passivation layer. This may be achieved a number of ways. In one embodiment, the substrate is dipped in a thin viscous layer of the template material over a flat plate, bump side down. By controlling the precise depth, level, and plumb of the substrate, the coating can occur on the bump surface only. An example template material may include material commonly used in solder flux material such as rosin and other natural or synthetic resins in an organic solvent such as polyethylene glycol ether. The template material does not contact the passivation layer or other bumpless parts of the substrate surface besides the bumps. Depending on the bump template material, the substrate may be hard baked before further processing. An example hard baking parameter may be 75~150 degrees Celsius for 1-3 minutes. This embodiment is referred to as selective depth dipping.

In another embodiment, the substrate is dipped in a thin viscous layer of the template material bump side down without controlling for the depth. However, the template material may selectively coat the bump only without coating the passivation layer by selecting a template material to exploit the different surface properties of the bump and the passivation layer. A template material including an appropriate surfactant may prefer the surface properties of the bump material over that of the passivation layer, for example, one surface may be hydrophilic and another hydrophobic. Such a template material forms a wetting layer on the bump material only and not on the passivation layer. The wetting layer may be set or cured by heating or chemical reaction and the remaining template material may be removed before or after the setting or curing. In one example, template material remaining on the passivation layer not wetting the bumps may be removed by blowing a gas across the substrate. In another example, a cleaning solution is used to remove the remaining template material. This cleaning solution would be different from that used to later remove the bump template layer after tape removal. In other words, the template material would be selected according to its ability to dissolve in different solutions before and after curing.

In yet another embodiment, the template material may be set or cured by exposing the substrate to radiation at an angle, such that area below the bump waist are not exposed, i.e., the passivation layer and UBM edges. An example of this type of template material may be a photoresist. The unexposed bump template material does not form the bump template layer and may be removed by spraying the surface with a solvent that does not dissolve the cured template layer. This embodiment is referred to as angled radiation exposure.

The bump template material may be an organic or inorganic material and may be soluble in water or in an organic solvent. The selection of the material depends on the method of applying the bump template layer and the method of removing the tape residue after the tape is de-laminated. For example, certain types of material used in soldering flux are good for the selective depth dipping embodiment because techniques for dipping a precise amount and depth of flux is already known. Appropriate materials include synthetic resin dispersed in a viscous and high-boiling temperature solvent. In another example, a photoresist type material may be selected for the angled radiation exposure embodiment because the resist can protect the bump area exposed to radiation and known methods can remove the unexposed resist. Given these examples, one skilled in the art would be able to formulate additional methods to apply a bump template layer and select the appropriate material.

In certain embodiments, applying the bump template material over the entire substrate surface could reduce the tape adhesion. This is countered by selectively applying the bump template layer according to FIG. 3 to allow a portion of tape adhesive to directly contact the passivation layer. In other embodiments, appropriate template material and organic tape adhesive are selected to allow an application of the template material over the entire substrate without reducing tape adhesion. Other methods to deal with this issue may be to allow the tape to adhere to the top of the bumps (e.g. solder alloy, gold copper, other metals, etc.), i.e., the portion furthest away from the substrate. In these embodiments, the bump template material may coat the entire substrate surface and then the top of the bumps may be cleaned prior to hard baking, for example, by wiping the top of the bumps. Because tape residue is more easily cleaned from the top of the bumps than from the waist area, using the bump tops for adhesion may simplify the process without increasing the likelihood of having tape residue remaining.

With the increase in number of semiconductor devices on a chip, the number of external connections increases. To accommodate more external connections, the bump size and pitch becomes smaller and smaller. This trend increases the importance of having a residue-free wafer, as residues on smaller bumps that are closer together are more likely to cause problems.

Figure 4:
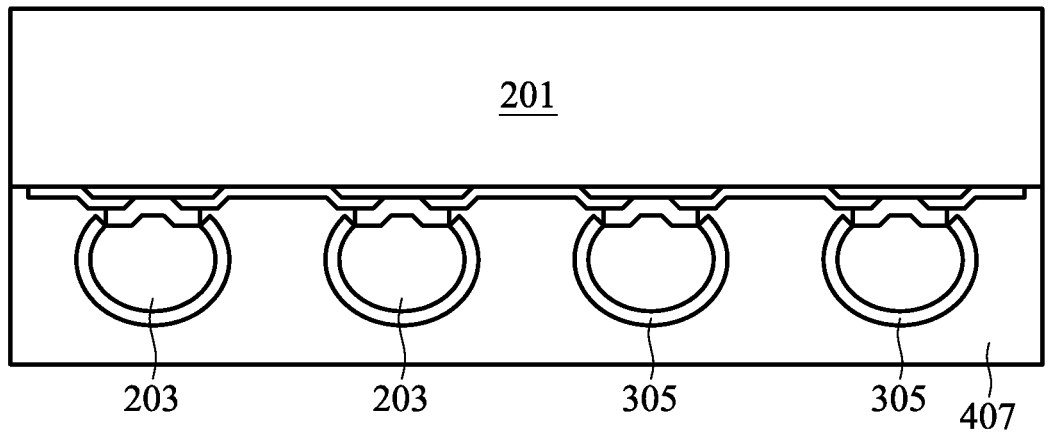

Referring to FIG. 1, after the bump template layer is applied and formed on the bumps, an organic-adhesive tape is laminated over the bumps in operation 105. The substrate having a laminated tape is shown in FIG. 4. Organic-adhesive tape 407 may be a UV tape or a non-UV tape. The lamination process is generally well known. After the lamination, further processing is performed on the wafer. As shown in optional operation 107 of FIG. 1, a backside of the wafer may be grinded to a small thickness, for example 20-100 microns. During the back grinding, the wafer is held by a handler from the taped side. Hence the tape protects the bumps from the handler. The back grinding reduces the weight of the chip and the thinned chip has important applications for some small portable devices. Although back grinding is shown and discussed, other semiconductor processing may be performed instead or in addition to back grinding.

Figure 5:
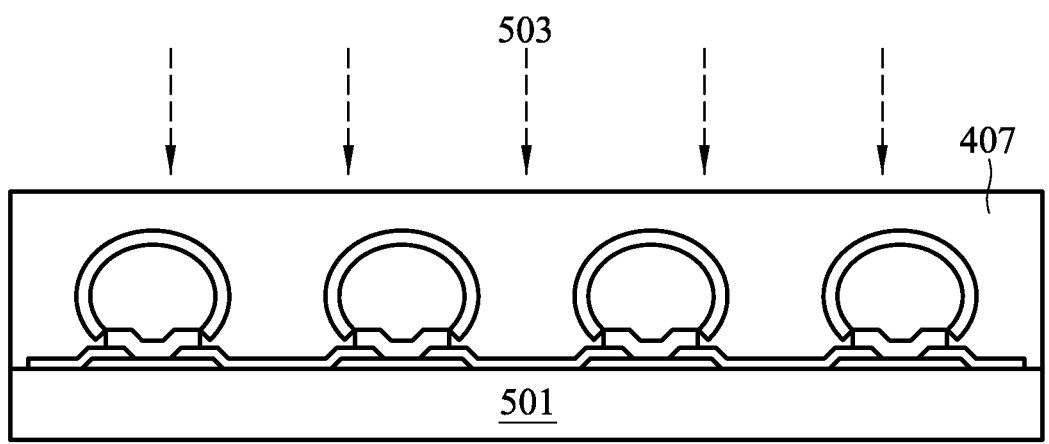
Figure 6:
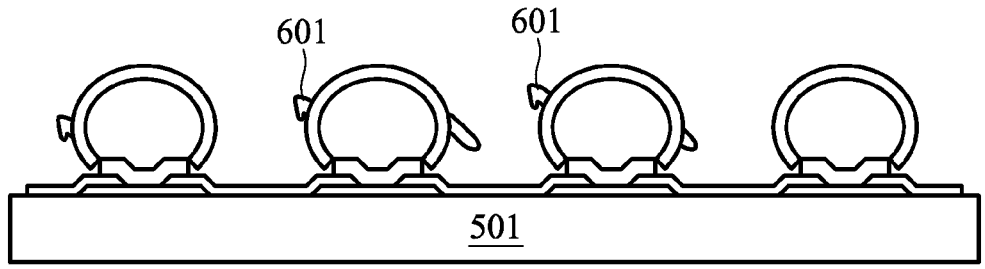

After the further processing, for example, back grinding, is completed on the wafer, the organic-adhesive tape is de-laminated according to operation 109 of FIG. 1. Delamination may consist of different steps depending on the type of organic-adhesive tape used. FIG. 5 shows one example where a UV tape is used on a wafer that is back grinded. The tape 407 on thinned substrate 501 is irradiated with UV radiation 503 that breaks certain bonds in the adhesive of the UV tape, rendering it easier to remove from the bumps and substrate surface. The tape removal may be performed by pulling the tape away from the substrate surface at an angle. It is preferred that all of the tape including all adhesives is removed from the surface; however, in practice many residues typically remain. Examples of tape residues are shown in FIG. 6 as elements 601. Note that tape residues may adhere anywhere from which the tape has been removed, including the top, side, or waist area of the bump, and surfaces of the passivation layer. In some other embodiments, the delamination operation may not require UV radiation, some other radiation may be applied. In still other embodiments where non-UV tape is used, no radiation is necessary and the tape may be pulled directly. Usually a de-lamination procedure is associated with a particular organic-adhesive tape and is performed per tape manufacturer's instructions.

Figure 7:
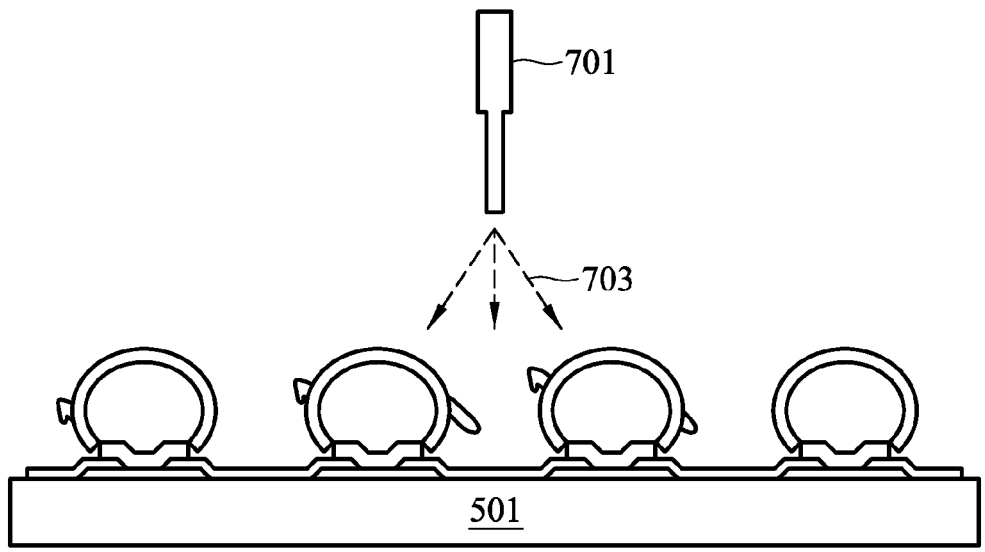

Referring to FIG. 1, after the organic-adhesive tape is de-laminated, the substrate bump surface is cleaned in operation 111. The cleaning may also occur after a dicing saw process. The cleaning operation removes all tape residues along with the bump template layer applied in operation 103. FIG. 7 shows one embodiment of the cleaning operation. A nozzle 701 is used to spray a solution 703 onto the substrate surface. The solution 703 includes a solvent that can dissolve the bump template layer. According to various embodiments, the solvent may be deionized water, alcohol, acetone, ether, or other organic and inorganic solvents. Note that the solution may be a gas. In one example where flux is used as the bump template material, the solvent may be deionized water. One skilled in the art would choose the appropriate cleaning solvent to match the bump template material and layer.

In certain embodiments, cleaning the substrate bump surface may include operations other than spraying. For example, a bump template layer may be chosen to have the property of sublimating upon heating. The substrate may be heated to an appropriate temperature to cause the bump template layer to sublimate, and the tape residue would become unattached to the substrate and can be easily removed by gas, gravity, or wiping. In another example, the bump template layer may be removed by chemical reaction. The substrate may be exposed to an oxidizing or reducing environment where the bump template layer would reduce or oxidize and form a gas, thereby removing the tape residue. Of course, these various examples must be practiced with care to avoid adversely affecting device portions of the substrate.

Figure 8:
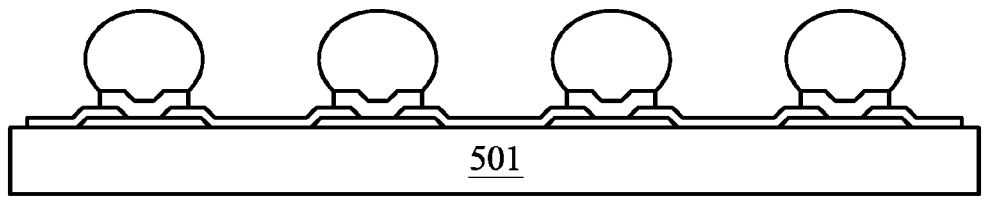

After the substrate is cleaned of the tape residue, the remaining bumps and substrate is as shown in FIG. 8. At this point, the substrate may be further treated, for example, with plasma before bonding to a package substrate. The process as described above expands the process window of UV dosage, tape material adhesive and film strength, and wafer surface treatment. Expansion of the process window allows more wafers to be processed under the same conditions, greatly reducing manufacturing complexity and therefore cost.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
providing a partially fabricated semiconductor device on a substrate having a first surface and bumps thereon;
applying a bump template layer on the bumps;
laminating an organic-adhesive tape directly over the first surface, wherein the organic-adhesive tape is over the bumps;
de-laminating the organic-adhesive tape from the first surface, wherein a portion of the organic-adhesive tape remains adhered on the bumps; and,
removing all of the portion of the organic-adhesive tape and the bump template layer by cleaning the first surface with a first solution.

2. The method of claim 1, wherein the bumps are solder alloy, gold, or copper.

3. The method of claim 1, further comprising backgrinding a second surface of the substrate before de-laminating the organic-adhesive tape.

4. The method of claim 1, further comprising exposing the organic-adhesive tape to UV radiation before de-laminating the organic-adhesive tape.

5. The method of claim 1, wherein applying a bump template layer comprises:
dipping the substrate in a thin viscous layer of organic template material; and
heating the first surface to form the bump template layer.

6. The method of claim 5, wherein the organic template material does not contact the first surface during the dipping operation.

7. The method of claim 4, wherein the heating operation comprises increasing the substrate temperature to between 75 degrees Celsius and 150 degrees Celsius for between 1 minute and 3 minutes.

8. The method of claim 1, wherein applying a bump template layer comprises:
coating the first surface and bumps with a bump template material;
curing the bump template material on the bumps without curing the bump template material on the first surface; and
removing uncured bump template material from the first surface.

9. The method of claim 1, wherein applying a bump template layer comprises:
coating the first surface and bumps with a bump template material, wherein the bump template material forms a wetting layer on the bumps but not on the first surface;
removing the bump template material from the first surface; and,
forming a bump template layer from the wetting layer.

10. The method of claim 9, wherein removing the bump template material from the first surface comprises cleaning the first surface with a second solution, wherein the second solution is different from the first solution.

11. The method of claim 1, wherein the bump template layer comprises a resin.

12. The method of claim 1, wherein the organic-adhesive tape is a backgrinding tape.

13. The method of claim 1, wherein the bump template layer comprises a water soluble organic material.

14. The method of claim 1, wherein the bump template layer comprises a polyethylene glycol ether.

15. The method of claim 1, wherein said bump template layer does not cover bumpless areas of the first surface.

16. The method of claim 1, wherein the first surface comprises a polyimide layer.

17. A method of manufacturing residue-free post-thinning wafer, said method comprising:
providing a partially fabricated semiconductor substrate having a first surface and bumps thereon;

dipping the substrate in an organic template to form a bump template layer;

laminating an adhesive tape directly over the first surface, wherein the organic-adhesive tape is over the bumps;

thinning the substrate from a second surface opposite of the first surface;

de-laminating the adhesive tape from the first surface, wherein a portion of the adhesive tape remains adhered on the bumps; and, removing all of the portion of the adhesive tape and the bump template layer by cleaning the first surface with a solution.

18. The method of claim 17, wherein the de-laminating operation comprises:

exposing the adhesive tape to UV radiation; and pulling the adhesive tape away from the first surface.

19. The method of claim 17, wherein the organic template coats the bumps and substantially not the first surface where there is no bump.

20. The method of claim 17, wherein the solution is at least one of de-ionized water, alcohol, acetone, or an ether.

* * * * *